(12) United States Patent
Kuisma (10) Patent No.: US 10,317,669 B2
(45) Date of Patent: Jun. 11, 2019

(54) MICRO-OPTICAL ELECTROMECHANICAL DEVICE AND METHOD FOR MANUFACTURING IT

(71) Applicant: MURATA MANUFACTURING CO., LTD., Nagaokakyo-shi, Kyoto (JP)

(72) Inventor: Heikki Kuisma, Helsinki (FI)

(73) Assignee: MURATA MANUFACTURING CO., LTD., Nagaokakyo-shi, Kyoto (JP)

( * ) Notice: Subject to any disclaimer, the term of this patent is extended or adjusted under 35 U.S.C. 154(b) by 0 days.

(21) Appl. No.: 14/755,828

(22) Filed: Jun. 30, 2015

(65) Prior Publication Data

US 2016/0004070 A1    Jan. 7, 2016

(30) Foreign Application Priority Data

Jul. 1, 2014    (FI) .................................... 20145639

(51) Int. Cl.
 *G02B 26/08* (2006.01)
 *H01L 41/314* (2013.01)
 *H01L 41/311* (2013.01)
 *G02B 26/10* (2006.01)

(52) U.S. Cl.
 CPC ....... *G02B 26/0858* (2013.01); *G02B 26/101* (2013.01); *H01L 41/311* (2013.01); *H01L 41/314* (2013.01)

(58) Field of Classification Search
 CPC .. G02B 26/10; G02B 26/105; G02B 27/0031; G02B 26/124; G02B 26/0858; G02B 26/101; G02B 26/08; G02B 26/0816; G02B 26/0833; G02B 26/12; G02B 26/121; H04N 1/1135; H01L 41/314; H01L 41/311

USPC ....................................................... 359/212.1
See application file for complete search history.

(56) References Cited

U.S. PATENT DOCUMENTS

| 8,139,280 B2 | 3/2012 | Wu |
| 8,724,200 B1 | 5/2014 | Wu |
| 2004/0150871 A1 | 8/2004 | Yang |
| 2006/0262378 A1 | 11/2006 | Machida et al. |
| 2010/0202040 A1 | 8/2010 | Morgan |
| 2012/0194890 A1 | 8/2012 | Park et al. |
| 2014/0320943 A1* | 10/2014 | Oyama .............. G02B 26/0858 359/198.1 |

FOREIGN PATENT DOCUMENTS

| JP | 2004-117525 A | 4/2004 |
| JP | 2008-015256 A | 1/2008 |

(Continued)

OTHER PUBLICATIONS

International Search Report application No. PCT/IB2015/054902 dated Oct. 30, 2015.

(Continued)

*Primary Examiner* — William R Alexander
*Assistant Examiner* — Henry A Duong
(74) *Attorney, Agent, or Firm* — Squire Patton Boggs (US) LLP (57) ABSTRACT

According to an embodiment, a micro-optical electromechanical device includes a body, a mirror element, and a spring structure configured to flexibly support the mirror element to the body. The spring structure includes at least one piezoelectric transducer adapted to induce in the spring structure a displacement that moves the mirror element.

17 Claims, 6 Drawing Sheets

(56) References Cited

FOREIGN PATENT DOCUMENTS

JP        2010-286609 A       12/2010
JP         2010286609 A   *  12/2010

OTHER PUBLICATIONS

Finnish Search Report dated Jan. 20, 2015 corresponding to Finnish Patent Application No. 20145639.
Taiwanese Search Report issued in corresponding Taiwanese Patent Application No. 104120909 dated Apr. 10, 2017.

* cited by examiner

MICRO-OPTICAL ELECTROMECHANICAL DEVICE AND METHOD FOR MANUFACTURING IT

BACKGROUND

Field:

The present invention relates to micro-optical electromechanical devices and especially to a micro-optical electromechanical device and a method for manufacturing a micro-optical electromechanical device, as defined in the preambles of the independent claims.

Description of the Related Art:

Mirrors for reflecting a beam of light have been developed based on MEMS technologies. In a scanning mirror, the direction of reflection can be changed as a function of time. A scanning mirror can direct the light beam over a range of directions in one or two dimensions, and it may also be used to collect light from a range of directions with good angular accuracy and resolution. Scanning operation over an angular range is obtained by tilting the mirror to an angle and varying this angle as a function of time. Often this is done in a periodical or oscillating manner. To obtain high scanning angular amplitude the mirror may be operated in a resonant mode. A resonant mirror may be supported by springs. The rotational inertia of the mirror, and the spring forces are the elements forming a mechanical resonator. There are several applications for such scanning mirrors, e.g. code scanners, scanning displays and laser ranging and imaging sensors (Lidars).

It has been recognized that a silicon wafer is an excellent raw material for a scanning mirror since it is available in a highly polished form, it has low weight and excellent springs can be produced to the same silicon wafer to enable operation in a resonant mode. The earliest silicon scanning mirrors were utilizing electromagnetic forces to excite the scanning motion. They had current loops on the moving part, and permanent magnets attached to the body of the mirror device. Later mirrors with electrostatic actuation were developed, and they didn't require large size permanent magnets. U.S. Pat. No. 8,305,670 is an example of the state of the art of electrostatically actuated scanning mirrors.

Figure 1A:
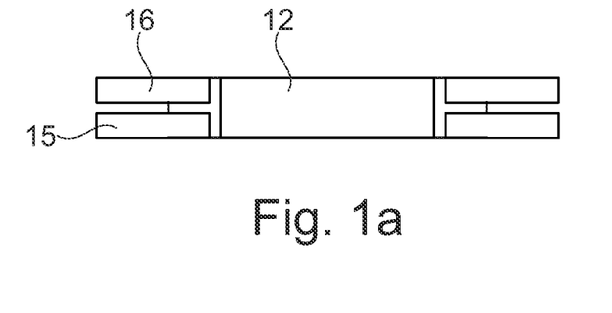
FIGS. 1a to 1c illustrate basic principles of a conventional electrostatically driven mirror.
Figure 1B:
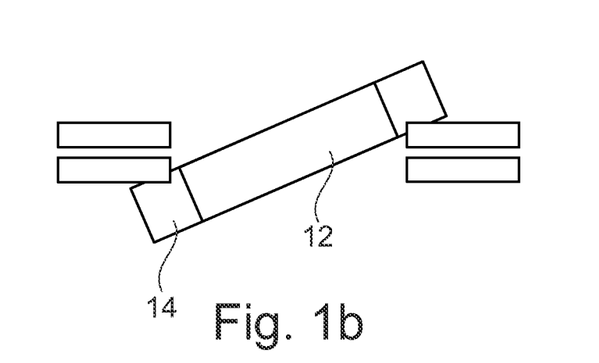
Figure 1C:
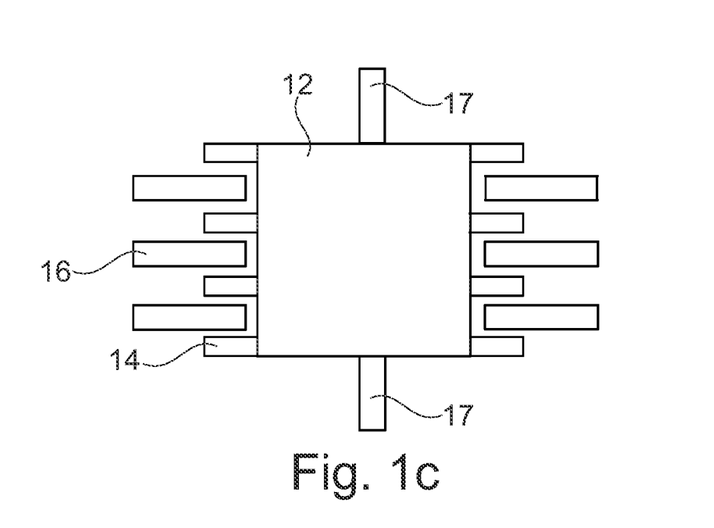

FIGS. 1a to 1c illustrate basic principles of a conventional electrostatically driven mirror. FIG. 1a is a cross section of the device with the mirror 12 in rest position. FIG. 1b shows the cross section when the mirror 12 is tilted and FIG. 1c shows the top view of the device. To the mirror 12 moving comb electrodes 14 are attached. First stationary comb electrodes 15 and optionally second stationary comb electrodes 16 are attached to the non-moving body of the mirror device (not shown). The mirror is suspended with torsion springs 17 to the mirror body.

Voltages are applied between moving and stationary comb electrodes and controlled so that a force is created in a vertical direction causing the mirror to tilt. The force is proportional to the second power of the applied voltage and to the second power of the inverse of the distance between electrodes. Voltages up to 200 V have been used to drive such electrostatic actuating transducers.

In addition to the high voltages needed, the electrostatic actuator has other limitations when used in scanning mirrors. For a high force the distance between electrodes should be made as small as possible. In practice this distance is limited by the thickness of the material and the maximum aspect ratio of the etching method used to manufacture the electrodes. In practice the maximum practical aspect ratio is less than 50:1. The force is maximized for a given aspect ratio if the distance between the electrodes is made as small as possible. For example, if this distance was chosen to be 2 µm, the height of the electrode would be 100 µm or less with a realistic etching process.

The required size and the required scanning angle of the mirror depend on the application. A mirror for a lidar should be quite large for efficient light collection and so is the required angle: 7 mm diameter and +−15 degrees scanning angle have been presented as target values for an automotive lidar in the EU-funded MiniFaros-project. With this diameter and angle, the edge of the mirror will be displaced by +/−900 µm from the rest position. If the height of the electrode is 100 µm, the electrode overlap will be zero for roughly 90% of the time during which no force is produced. Electrostatic drive is thus very inefficient for large amplitude excitation.

Due to manufacturing reasons and due to the large amplitude required, the electrostatic transducers are conventionally located at the periphery of the mirror, such as in U.S. Pat. No. 8,305,670. This increases the size of the mirror device and also the rotational inertia of the mirror, which must be compensated by higher force.

SUMMARY

An object of the present invention is to provide a micro-optical electromechanical device structure that in a given component area dimension provides a large single movable mirror surface and large tilt angles for said mirror surface, and at the same time avoids or alleviates at least one problem of the conventional configurations. Various objects of the present invention are achieved with a micro-optical electromechanical structure, and a manufacturing method as described herein.

In one embodiment, the invention includes a micro-optical electromechanical scanning device that includes a body, a mirror element, and a spring structure adapted to flexibly support the mirror element to the body. The mirror element includes a mirror formed of a planar reflecting surface on a mirror base part, the direction of the plane of the mirror at rest being the first direction. The body at least partly circumscribes the mirror element, separated from the mirror element at least by a gap. The mirror element includes two or more pedestals, and the spring structure includes bending springs, wherein each bending spring connects to the body through a first connection point and to one pedestal through a second connection point. Each pedestal extends between the second connection point and a third connection point opposite the mirror in the mirror base part. Each pedestal is also adapted to rigidly maintain a non-zero distance between the second connection point and the third connection point in the direction perpendicular to the first direction. The spring structure includes piezoelectric transducers configured to induce in each of the bending springs a displacement that moves the second connection point of the bending spring at least in a direction perpendicular to the first direction.

In certain embodiments, the piezoelectric transducer includes at least one thin-film layer of piezoelectric material on one side of the bending spring.

In some embodiments, the piezoelectric transducer includes a stack of films of conductive materials and piezoelectric materials, for inducing a voltage over the piezoelectric materials.

In some embodiments, each of the bending springs is located within and below a surface area of the mirror such that the piezoelectric thin film layer has a non-zero projection on the plane of the mirror.

In certain embodiments, a surface of the body is aligned with the plane of the mirror, and the mirror is separated from the surface of the body by a gap.

In certain embodiments, the spring structure includes a pair of bending springs with piezoelectric transducers. The two bending springs are in opposite positions such that the mirror is tilted about a pivot axis in response to excitation of the piezoelectric transducers of the opposite bending springs with opposite polarities.

In some embodiments, the spring structure includes N bending springs with piezoelectric transducers, the N bending springs symmetrically surrounding a pivot point such that the mirror is tilted about the pivot point in response to excitation of the piezoelectric transducers of the opposite bending springs with voltages in 360/N degree phase difference.

In some embodiments, the first direction, the distance from the third connection point to the pivot axis or to the pivot point is less than half the distance from the pivot axis or from the pivot point to the edge of the mirror.

In some embodiments, the first direction, the distance (r) from the third connection point to the pivot axis or to the pivot point is less than ten times the distance (R) from the pivot axis or from the pivot point to the edge of the mirror.

In some embodiments, the gap between the body and the mirror base part includes further cut-outs from the mirror base part to enable tilting of the mirror base part beyond the level of the bending springs in the direction perpendicular to the first direction.

In some embodiments, the bending springs have two or more bending parts, providing flexibility in two or more directions.

In some embodiments, a further spring structure is configured to resist unwanted modes of motion of the mirror base part.

In some embodiments, the further spring structure includes a pair of torsion springs, each torsion spring extending from the mirror base part to the body along the pivot axis.

Embodiments of the invention also include a method for manufacturing a micro-optical electromechanical device that includes a body, a mirror element, and a spring structure adapted to flexibly support the mirror element to the body. The method includes applying a cavity silicon-on-insulator process for creating cavities for the mirror element and the body element into a first silicon wafer, wherein the mirror element includes a mirror base part, and two or more pedestals extending out from the mirror base part, bonding a second silicon wafer on the first silicon wafer, creating a spring element layer from the second silicon wafer, depositing piezoelectric transducers for each of the pedestals on top of the spring element layer of the second silicon wafer, forming bending springs for each of the pedestals by creating one or more openings in the second silicon wafer, and separating the mirror element from the body of the device by creating one or more openings in the first silicon wafer.

Further advantages of the invention are discussed in more detail with the following embodiments.

BRIEF DESCRIPTION OF THE DRAWINGS

In the following the invention will be described in greater detail, in connection with preferred embodiments, with reference to the attached drawings, in which.

DETAILED DESCRIPTION

The following embodiments are exemplary. Although the specification may refer to "an", "one", or "some" embodiment(s), this does not necessarily mean that each such reference is to the same embodiment(s), or that the feature only applies to a single embodiment. Single features of different embodiments may be combined to provide further embodiments.

In the following, features of the invention will be described with a simple example of a device architecture in which various embodiments of the invention may be implemented. Only elements relevant for illustrating the embodiments are described in detail. Various implementations of micro-optical electromechanical structures that are generally known to a person skilled in the art may not be specifically described herein.

Figure 2:
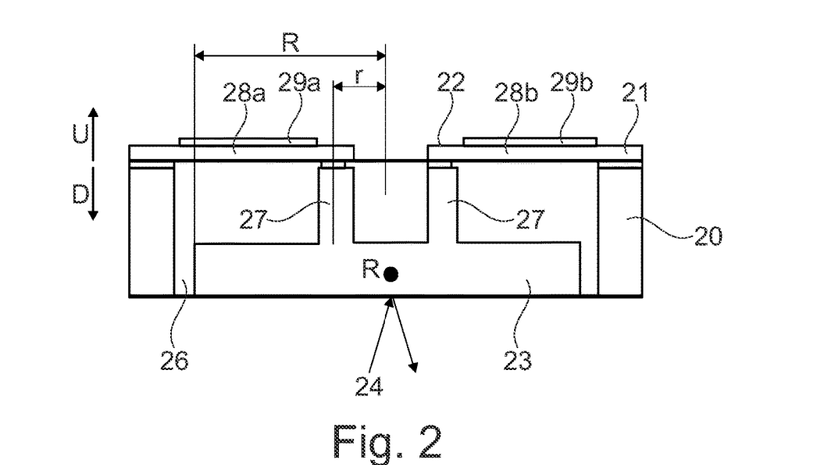
FIG. 2 illustrates an embodiment of a micro-optical electromechanical structure according to embodiments of the invention.

FIG. 2 illustrates an embodiment of an improved micro-optical electromechanical structure. A micro-optical electromechanical device includes a body 20, a mirror element 23, 27, and a spring structure 28a, 28b adapted to flexibly support the mirror element 23, 27 to the body 20. As shown in FIG. 2, the body 20 circumscribes the mirror element, and is separated from the mirror element at least by a gap 26. This means that in a cross-section, the body forms a sideways closed or partly open space within itself, and thereby at least partly encompasses in projection the mirror element.

The mirror element includes a mirror 24 formed of a planar reflecting surface. A surface of the body 20 that circumscribes the mirror element may be aligned to the mirror 24. The spring structure 28a, 28b includes at least one piezoelectric transducer 29a, 29b configured to induce in the spring structure a displacement and thereby move the mirror element it supports. FIG. 2 shows an example where, on the springs 28a, 28b supporting the mirror element 23, 27, thin film piezoelectric actuating transducers 29a, 29b are fabricated. The piezoelectric actuating transducers 29a, 29b produce high force at much lower voltage than the conventional electrostatic transducers, and are active 100% of the time, notwithstanding the motion of the mirror. The piezoelectric thin film transducers 29a, 29b may consist of a stack of conductive and piezoelectric films that allow application of a voltage over the piezoelectric material causing thus its expansion or contraction depending on the polarity of the applied voltage. This contraction and expansion on one surface of the spring will cause the spring to bend up U or down D, respectively.

Contrary to the electrostatic comb transducers, the piezoelectric transducers on the springs can be fabricated to the side opposite to the reflecting surface of the mirror 24 in the micro-optical electromechanical device. The transducers can thereby occupy at least partly, or even mainly the same surface area as the mirror 24. In other words, the piezoelectric thin film layers 29a, 29b may have a non-zero projection on the plane of the mirror, so that practically no extra area is consumed by the transducers in the surface where the mirror 24 is. In FIG. 2 the spring 28b is on one end 21 (first connection point) attached to the body 20 of the micro-optical electromechanical device, and on the other end 22 (second connection point) to a mirror base part 23 via a pedestal 27. The outer dimension of the mirror 24 may be nearly equal to the inner dimension of the body 20, being separated only by a narrow gap 26.

Furthermore, a lever effect can be used to increase the angular amplitude of the mirror 24 if the pedestals 27 are located close to the center of the mirror base part 23. In FIG. 2 a mirror radius or half-width is denoted by R and the radial distance of the pedestal 27 from the center of rotation (pivot axis) of the mirror is denoted by r. It may be required that r is smaller than R, at least smaller than R/2 but preferably as small as R/10 or even smaller, giving thus amplification of the angular amplitude. If r=R/10 and the end of the spring 28b attached to the pedestal 27 is displaced up or down by 50 μm due to force generated by the transducer 29b then the edge of the mirror is displaced tenfold by 500 μm.

Opposite springs may be applied to induce tilting about a pivot axis. To produce pure tilting and no translation of the mirror, a pair of opposite springs, a first spring 28a and a second spring 28b, may be located on opposite sides of the mirror symmetrically and transducers 29a, 29b on these opposite springs can be excited with opposite polarities so that the second spring 28b will deflect to a direction opposite to the first spring 28a. In FIG. 2, an exemplary pivot axis is denoted by P.

In embodiments with more than two springs, the symmetrical suspension and anti-symmetrical excitation can be produced with many combinations of spring locations and driving voltages. An example shown in FIG. 3 uses three springs 38 that connect to pedestals 37 that are at 120 angle to each other. The pedestals 37 support a mirror that can be scanned in two directions. If alternating voltages are applied to the transducers so that there is a 120 degrees phase difference between the voltages fed to the three transducers of the springs 38, a constant tilt angle but a moving tilt direction can be obtained. This wobbling motion of the mirror about a pivot point is useful in lidar applications. The same principle can be applied to any N number of springs and 360/N degrees phase difference between the voltages.

Figure 3:
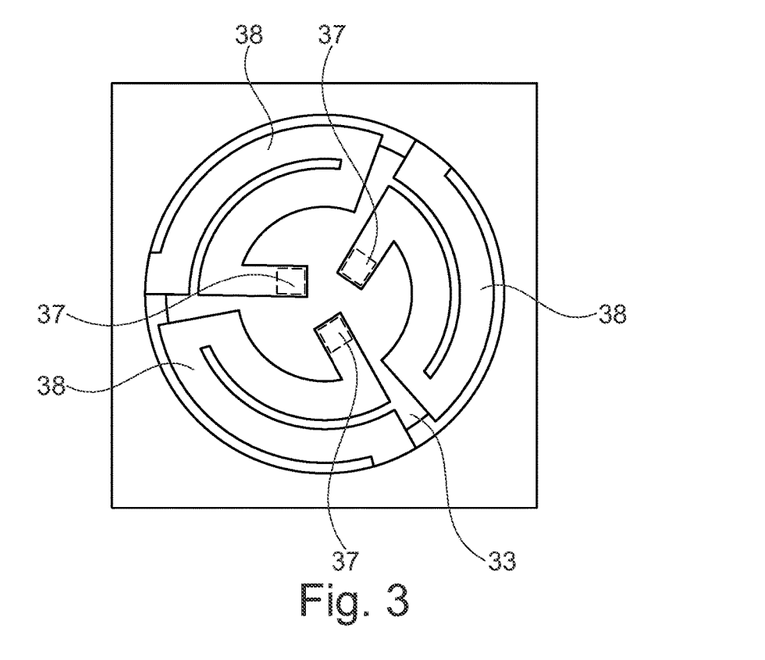
FIG. 3 illustrates an embodiment with three springs at 120 angles to each other to support a mirror that can be scanned in two directions.

The height of the pedestals 27, 37 should be large enough to allow the desired angular tilt of the mirror base part 23 without touching the springs 28a, 28b. In the disclosed structure where the body circumscribes the pedestal and the mirror base part of the mirror element, the height of the pedestals can be conveniently close to the thickness of a silicon wafer. A height up to 500 μm is practical for the pedestals and even up to 1 mm is possible when using silicon wafers as raw material.

Figure 4:
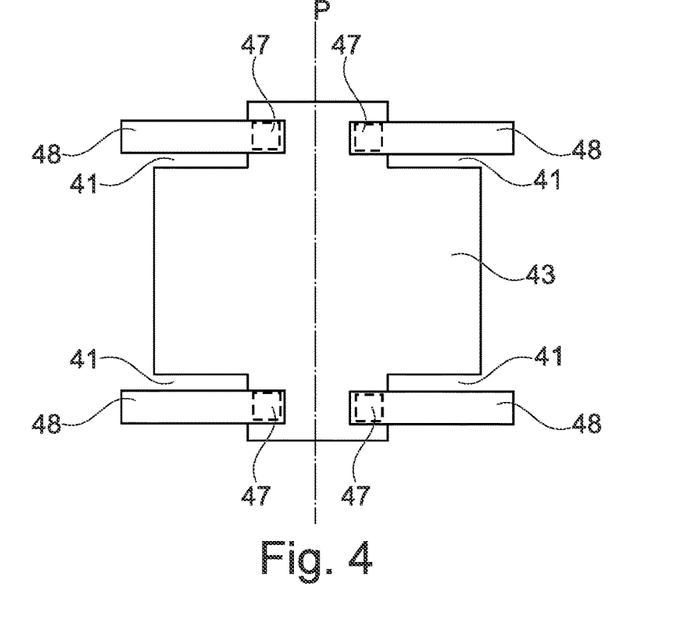
FIG. 4 illustrates cut-outs in an embodiment with four springs attached to corresponding pedestals.
Figure 5:
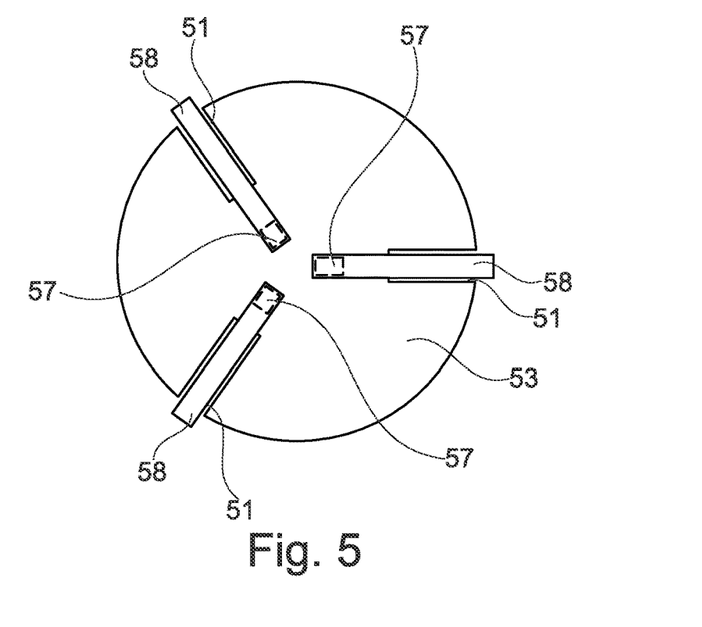
FIG. 5 illustrates cut-outs in an embodiment with three springs attached to corresponding pedestals.

The shape of the mirror base part 23 can also help in allowing higher amplitudes without touching the springs 28a, 28b. FIG. 4 illustrates a mirror base part 43 that can be tilted about a pivot axis with four springs 48 attached to corresponding pedestals 47. As an example, an exemplary pivot axis of FIG. 4 is denoted by P. In the exemplary structure of FIG. 4, the springs 48 are placed at least partly on locations where there are cut-outs 41 on the mirror base part 43, such that the cut-outs 41 allow the mirror base part to tilt beyond the level of the springs 48 without touching them. FIG. 5 illustrates similar cut-outs 51 for three springs 58 attached to pedestals 57. The cut-outs 51 allow the mirror base part 53 to be pivoted in two directions, as described above with FIG. 3.

The number of the springs and their size and shape can vary greatly within the limits of the invention. FIG. 3 illustrates one possible configuration with three springs 38 that apply the area below the mirror base part 33 efficiently and allow tilting in two directions. The configuration of FIG. 3 includes three folded springs 38 attached to pedestals 37.

Figure 7:
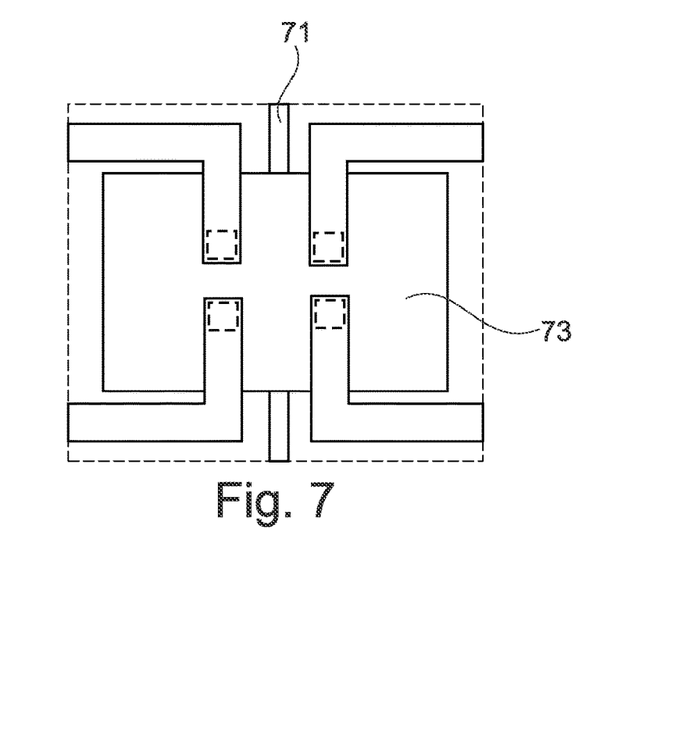
FIG. 7 illustrates an embodiment with an alternative spring structure and a stabilizing element.

FIG. 7 illustrates an L-shaped spring structure that provides flexibility in two directions and thereby maximizes the length of the bending spring. The space provided by the surrounding body is shown in the Figure with a dashed line. The L-shaped form increases the displacement provided by the bending spring in the very compact available surface area.

However, in addition to the desired pure angular motion, the combination of pedestals and bending springs may cause an undesirable lateral linear motion for the mirror base part 23. FIG. 7 illustrates a structure where a further spring structure is adapted to resist unwanted modes of motion of the mirror base part. As shown in FIG. 7, the further spring structure may include a pair of torsion springs 71 that extend from the mirror base part 73 to the body. The torsion springs are advantageously aligned to the pivot axis, and stabilize movement the mirror base part to the desired angular motion.

Figure 8:
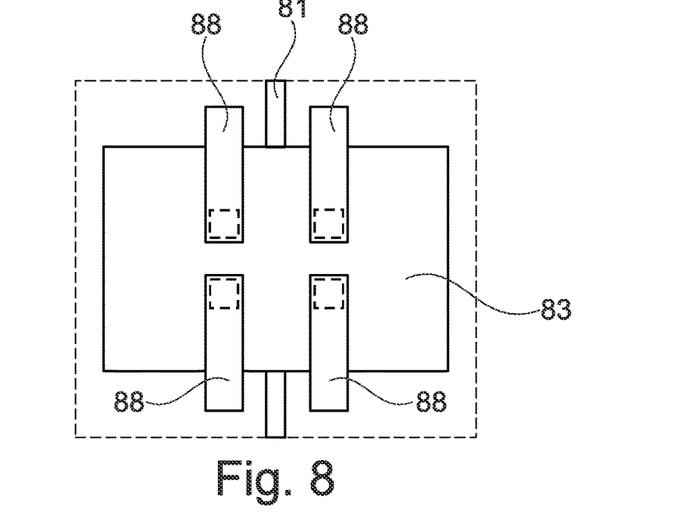
FIG. 8 illustrates another embodiment with an alternative spring structure and a stabilizing element.

FIG. 8 illustrates another possibility to obtain the desired flexibility of the springs 88 in lateral direction and at the same time to prevent linear motion of the mirror base part 83. Additional springs 81 may again be optionally used to force the motion of the mirror to pure angular (tilting) motion. As shown in FIG. 8, the further spring structure may again include a pair of torsion springs 81 that extend from the mirror base part 83 to the body. The torsion springs are advantageously aligned to the pivot axis, and stabilize movement the mirror base part 83 to the desired angular motion.

It is recognized that FIGS. 2 through 5, 7 and 8 are simplified examples to explain the basic ideas of the invention. Further application specific dimensioning and spring designs may be used, for example, to avoid unwanted modes of motion of the mirror.

Figure 6A:
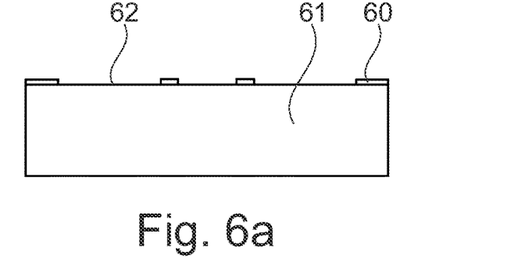
FIGS. 6a through 6g illustrate an embodiment of a process for manufacturing the micro-optical electromechanical device.
Figure 6B:
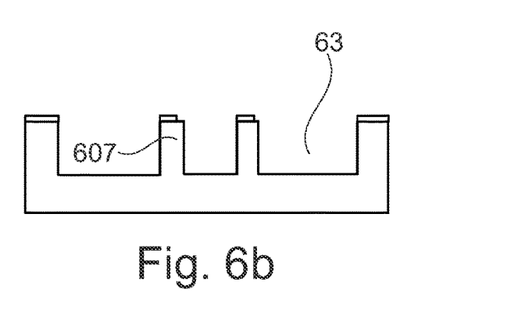
Figure 6C:
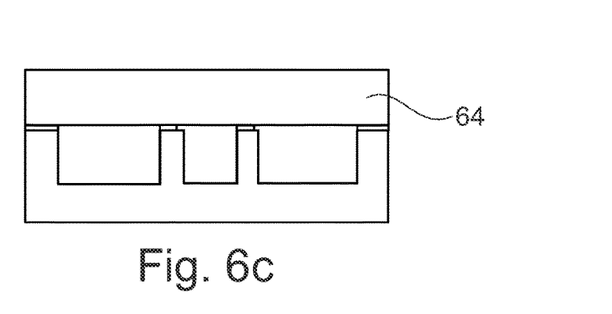
Figure 6D:
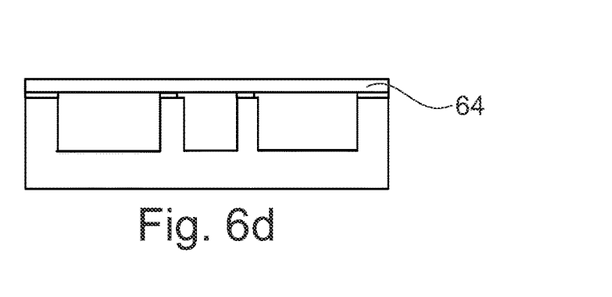
Figure 6E:
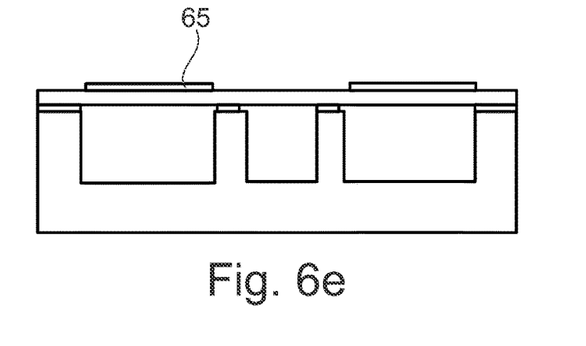
Figure 6F:
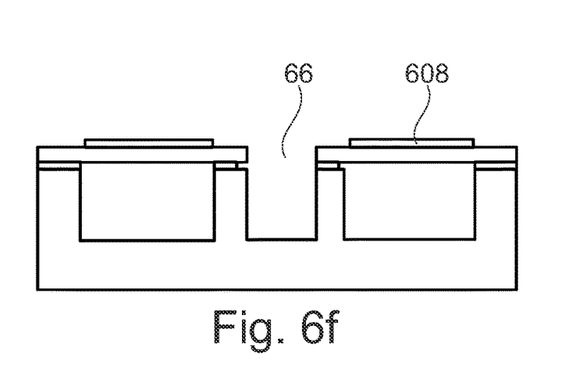
Figure 6G:
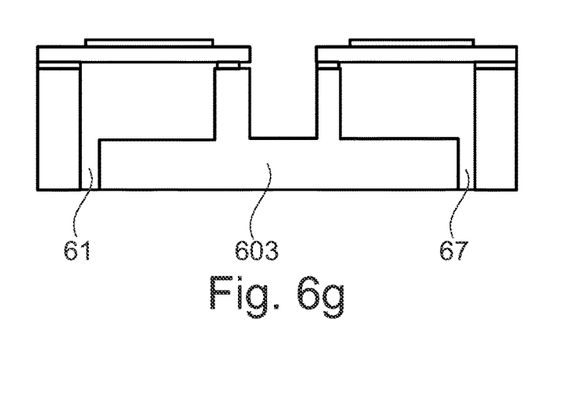

As a further advantage, manufacturing of the described structure of mirror elements with pedestals, springs and transducers on a silicon wafer is readily possible by using state of the art MEMS technologies. FIGS. 6a through 6g illustrate an embodiment of a process for manufacturing the micro-optical electromechanical device described with FIGS. 1 to 5 and 7 to 8. Stages 6a to 6d illustrate manufacturing of the claimed device structures by a standard cavity SOI process sequence readily available from wafer vendors. In the stage of FIG. 6a, an insulating film 60 is formed on a first silicon wafer 61 and patterned to form openings 62. In the stage of FIG. 6b, the first silicon wafer is etched to form cavities 63 at the openings 62 to a desired depth dictated by the desired height of the pedestals 607. In the stage of FIG. 6c, a second silicon wafer 64 is bonded to the surfaces of the insulating film 60. In FIG. 6d this second wafer 64 is thinned down to the desired thickness of the springs. In the stage of FIG. 6e, thin film piezoelectric transducers 65 are manufactured on top of the wafer 64. This process may require several deposition and patterning steps for different materials, e.g. Al, Pt, Mo or other metal films for electrodes and piezoelectric films of AlN, doped AlN, PZT or other piezoelectric materials. Insulating films may also be incorporated in the stack of films used for the transducers 65. Next the springs 608 are formed in the stage of FIG. 6f by etching openings 66 in the wafer 64. Finally the mirror base part 603 is separated from the body of the device in the stage of FIG. 6g by etching openings 67 in the wafer 61. This process sequence is just one example of how MEMS manufacturing methods can be used. Many other process sequences may as well be used to manufacture scanning mirrors of the present invention.

It is apparent to a person skilled in the art that as technology advances, the basic idea of the invention can be implemented in various ways. The invention and its embodiments are therefore not restricted to the above examples, but they may vary within the scope of the claims.

The invention claimed is:

1. A micro-optical electromechanical scanning device, comprising:
    a body;
    a mirror element including a mirror, a mirror base part, and two or more pedestals; and
    a spring structure configured to flexibly support the mirror element to the body,
    wherein the mirror comprises a planar reflecting surface on a mirror base part, a direction of a plane of the mirror at rest being a first direction,
    wherein the body at least partly circumscribes the mirror element, and is separated from the mirror element at least by a gap,
    wherein the spring structure includes bending springs, wherein each bending spring extends between the body and the mirror element by connecting to the body through a first connection point and to one pedestal through a second connection point, the first connection points of the bending springs forming a level of the bending springs,
    wherein each pedestal extends between the second connection point and a third connection point opposite the mirror in the mirror base part,
    wherein each pedestal is configured to rigidly maintain a non-zero distance between the second connection point and the third connection point in a second direction perpendicular to the first direction,
    wherein the spring structure includes piezoelectric transducers configured to induce in each of the bending springs a displacement that moves the second connection point of the bending spring at least in the direction perpendicular to the first direction, and
    wherein the mirror base part, from which the pedestals extend in the second direction, includes cut-outs that are configured to accommodate the bending springs, each of which extends between the body and a pedestal of the mirror element, at tilting of the mirror base part, and the cut-outs are configured to enable tilting of the mirror base part towards and beyond the level of the bending springs in the second direction.

2. The micro-optical electromechanical device of claim 1, wherein the piezoelectric transducer includes at least one thin-film layer of piezoelectric material on one side of the bending spring.

3. The micro-optical electromechanical device of claim 1, wherein the piezoelectric transducer includes a stack of films of conductive materials and piezoelectric materials, configured to induce a voltage over the piezoelectric materials.

4. The micro-optical electromechanical device of claim 1, wherein each of the bending springs is located within and below a surface area of the mirror such that a piezoelectric thin film layer has a non-zero projection on the plane of the mirror.

5. The micro-optical electromechanical device of claim 4, wherein
    a surface of the body is aligned with the plane of the mirror; and wherein
    the mirror is separated from the surface of the body by a gap.

6. The micro-optical electromechanical device of claim 1, wherein the spring structure includes a pair of bending springs with piezoelectric transducers, the two bending springs being in opposite positions such that the mirror is tilted about a pivot axis in response to excitation of the piezoelectric transducers of opposite bending springs with opposite polarities.

7. The micro-optical electromechanical device of claim 6, wherein in the first direction, a distance from the third connection point to the pivot axis or to a pivot point is less than half the distance from the pivot axis or from the pivot point to an edge of the mirror.

8. The micro-optical electromechanical device of claim 6, wherein in the first direction, the distance (r) from the third connection point to the pivot axis or to a pivot point is less than ten times the distance from the pivot axis or from the pivot point to an edge of the mirror.

9. The micro-optical electromechanical device of claim 1, wherein the spring structure includes N bending springs with piezoelectric transducers, the N bending springs symmetrically surrounding a pivot point such that the mirror is tilted about the pivot point in response to excitation of the piezoelectric transducers of opposite bending springs with voltages in 360/N degree phase difference.

10. The micro-optical electromechanical device of claim 1, wherein the bending springs have two or more bending parts, providing flexibility in two or more directions.

11. The micro-optical electromechanical device of claim 1, further comprising a further spring structure configured to resist unwanted modes of motion of the mirror base part.

12. The micro-optical electromechanical device of claim 11, wherein the further spring structure includes a pair of torsion springs, each torsion spring extending from the mirror base part to the body along a pivot axis.

13. A micro-optical electromechanical scanning device, comprising
    body means for housing device components therein;
    mirror means for providing a reflecting surface, the mirror means including a base means and two or more pedestal means; and
    spring means for flexibly supporting the mirror means to the body means,
    wherein the mirror means includes a planar reflecting surface on the base means, and wherein a direction of a plane of the mirror means at rest is a first direction,
    wherein the body means is separated by the mirror means by at least a gap,
    wherein the spring means extends between the body means and the mirror means by connecting to the body means and to the pedestal means through a first connection point and to one pedestal means through a second connection point, the first connection point of the spring means forming a level of the spring means,
    wherein each pedestal means extends between the second connection point and a third connection point opposite the mirror means in the base means, wherein each pedestal means is for rigidly maintaining a non-zero distance between the second connection point and the third connection point in a second direction perpendicular to the first direction, wherein the spring means includes transducer means for inducing a displacement in the spring means that moves the second connection point of the spring means at least in the direction perpendicular to the first direction, and wherein the base means, from which the pedestal means extend in the second direction, includes cut-outs that are configured to accommodate the spring means, each of which extends between the body means and a pedestal means of the mirror means, at tilting of the base means, and the cut-outs are configured to enable tilting of the base means towards and beyond the level of the spring means in the second direction.

14. The micro-optical electromechanical device of claim 13, wherein the transducer means comprises at least one thin-film layer of piezoelectric material on one side of the spring means.

15. The micro-optical electromechanical device of claim 13, wherein the transducer means comprises a stack of films of conductive materials and piezoelectric materials, for inducing a voltage over the piezoelectric materials.

16. The micro-optical electromechanical device of claim 13, wherein the spring means is located within and below a surface area of the mirror means such that the transducer means has a non-zero projection on the plane of the mirror means.

17. The micro-optical electromechanical device of claim 16, wherein the surface of the body means is aligned with the plane of the mirror means, and wherein the mirror means is separated from the surface of the body means by a gap.

* * * * *